(12) United States Patent
Lee et al.

(10) Patent No.: US 12,379,606 B2
(45) Date of Patent: Aug. 5, 2025

(54) FOLDABLE DISPLAY APPARATUS

(71) Applicant: LG Display Co., Ltd., Seoul (KR)

(72) Inventors: JongGun Lee, Paju-si (KR); JiChul Lim, Pyeongtaek-si (KR); SeungUn Park, Daegu (KR); Seoyoung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 798 days.

(21) Appl. No.: 17/526,763

(22) Filed: Nov. 15, 2021

(65) Prior Publication Data

US 2022/0209201 A1 Jun. 30, 2022

(30) Foreign Application Priority Data

Dec. 31, 2020 (KR) ........................ 10-2020-0189232

(51) Int. Cl.
| | |
|---|---|
| *H10K 50/86* | (2023.01) |
| *G02B 27/28* | (2006.01) |
| *H10K 59/80* | (2023.01) |
| *H10K 77/10* | (2023.01) |
| *H10K 102/00* | (2023.01) |

(52) U.S. Cl.
CPC ........... *G02B 27/286* (2013.01); *H10K 50/86* (2023.02); *H10K 59/871* (2023.02); *H10K 59/8791* (2023.02); *H10K 77/111* (2023.02); *H10K 2102/311* (2023.02)

(58) Field of Classification Search
CPC .............. H10K 50/86; H10K 77/111; H10K 2102/311; H10K 59/871; H10K 59/8791; G02B 27/286; G02B 5/3083; G02B 5/3025; G09F 9/301; G06F 1/1652
See application file for complete search history.

(56) References Cited

U.S. PATENT DOCUMENTS

| | | | |
|---|---|---|---|
| 9,358,768 | B2 | 6/2016 | Shin et al. |
| 10,401,675 | B2 | 9/2019 | Lee et al. |
| 10,551,538 | B2 | 2/2020 | Lee et al. |
| 11,296,305 | B2 | 4/2022 | Oh et al. |
| 2004/0252264 | A1 | 12/2004 | Shimizu |
| 2020/0075895 | A1* | 3/2020 | Oh .................. H10K 59/40 |
| 2020/0081162 | A1 | 3/2020 | Park et al. |
| 2020/0264356 | A1 | 8/2020 | Lee et al. |

FOREIGN PATENT DOCUMENTS

| | | |
|---|---|---|
| CN | 1550796 A | 12/2004 |
| CN | 103869401 A | 6/2014 |
| CN | 105629553 A | 6/2016 |

(Continued)

*Primary Examiner* — James R Greece
*Assistant Examiner* — Jose M Diaz
(74) *Attorney, Agent, or Firm* — Seed IP Law Group LLP

(57) ABSTRACT

A foldable display apparatus includes a display panel including a folding area and a non-folding area, the folding area configured to fold about a folding axis, a first lower retardation layer on the display panel, a second lower retardation layer between the display panel and the first lower retardation layer, a linear polarizer disposed on the first lower retardation layer, the linear polarizer having a polarization axis of 45±5° or 135±5° with respect to the folding axis of the display panel, and a window member on the linear polarizer.

17 Claims, 13 Drawing Sheets

(56) References Cited

FOREIGN PATENT DOCUMENTS

| | | |
|---|---|---|
| CN | 108121103 A | 6/2018 |
| CN | 108122488 A | 6/2018 |
| CN | 110874985 A | 3/2020 |
| CN | 110896094 A | 3/2020 |
| CN | 111580208 A | 8/2020 |
| KR | 10-2016-0055431 A | 5/2016 |
| KR | 10-2017-0106599 A | 9/2017 |
| KR | 10-2018-0061484 A | 6/2018 |
| KR | 20200026370 A | 3/2020 |

* cited by examiner

FOLDABLE DISPLAY APPARATUS

CROSS-REFERENCE TO RELATED APPLICATIONS

This application claims the benefit of, and priority to, Korean Patent Application No. 10-2020-0189232 filed on Dec. 31, 2020 in the Republic of Korea, the entire contents of which are hereby expressly incorporated by reference into the present application.

BACKGROUND

Technical Field

The present disclosure relates to a foldable display apparatus, and more particularly, to a foldable display apparatus having excellent reflective visibility at a main viewing angle.

Description of the Related Art

Recently, as our society advances toward an information-oriented society, the field of display apparatuses for processing and displaying a large amount of information has rapidly advanced. Display apparatuses used in computer monitors, TVs, and mobile phones include organic light emitting display (OLED) apparatuses that emit light by themselves, and liquid crystal display (LCD) apparatuses that require a separate light source.

Such display apparatuses are being applied to more and more various fields including not only computer monitors and TVs, but also personal mobile apparatuses, and thus, display apparatuses having a reduced volume and weight while having a wide display area are being studied. In particular, in recent years, a foldable display apparatus that is manufactured to display an image even when it is bent or folded like paper has received attention as a next-generation display apparatus.

However, known foldable displays have a number of disadvantages. For example, related art foldable displays struggle to satisfy consumer demand for improvements in display quality.

BRIEF SUMMARY

A foldable display apparatus according to the present disclosure may optimize reflective visibility by minimizing a difference in reflection color at a main viewing angle.

A foldable display apparatus according to the present disclosure may be capable of preventing a blackout phenomenon when a user wears polarized sunglasses and recognizing an image at an entire viewing angle.

A foldable display apparatus according to the present disclosure may also be capable of suppressing or reducing the occurrence of rainbow mura when wearing polarized sunglasses.

Such a flexible display apparatus has advantages in terms of space utilization, interior and design and can have various application fields. For example, in order to improve reflective visibility, a contrast ratio, and the like, a polarizing film for absorbing external light may be provided under a window member.

Additional features and aspects will be set forth in part in the description that follows, and in part will become apparent from the description or may be learned by practice of the inventive concepts provided herein. Other features and aspects of the inventive concepts may be realized and attained by the structure particularly pointed out in the written description, or derivable therefrom, and the claims hereof as well as the appended drawings.

A foldable display apparatus according to an embodiment of the present disclosure comprises a display panel including a folding area and a non-folding area configured to fold about a folding axis; a first lower retardation layer on the display panel; a second lower retardation layer between the display panel and the first lower retardation layer; a linear polarizer disposed on the first lower retardation layer, the linear polarizer having a polarization axis of 45±5° or 135±5° with respect to the folding axis of the display panel; and a window member on the linear polarizer. Through this, a foldable display apparatus in which black visibility and reflective visibility are improved due to a little change in reflection color even if a user's viewing angle is changed in a horizontal direction (leftward/rightward) or vertical direction (upward/downward) by minimizing the difference in reflection color at a main viewing angle can be provided.

According to an embodiment of the present disclosure, by disposing a plurality of retardation layers and specifying a polarization axis of a linear polarizer and optical axes of lower retardation layers, a difference in reflection color at a main viewing angle can be minimized and reflective visibility of a display apparatus can be improved.

According to an embodiment of the present disclosure, a blackout phenomenon and rainbow mura may be minimized or reduced when a user wears polarized sunglasses by using a plurality of retardation layers and a decoration film.

According to an embodiment of the present disclosure, an image can be recognized at an entire viewing angle when a user wears polarized sunglasses.

It is to be understood that both the foregoing general description and the following detailed description are non-limiting and explanatory in nature and are intended to provide further explanation of the concepts of the present disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain various principles of the disclosure. Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Figure 1A:
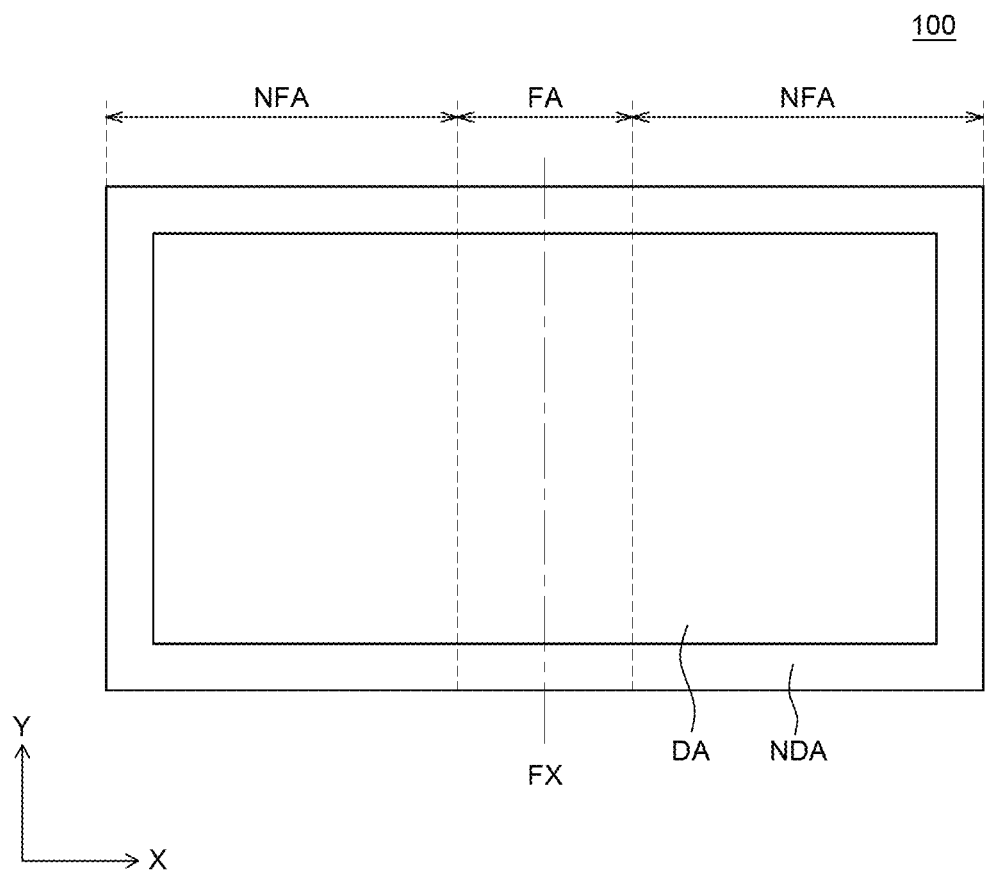
FIG. 1A is a plan view of a foldable display apparatus according to an embodiment of the present disclosure.

Reference will now be made in detail to embodiments of the present disclosure, examples of which may be illustrated in the accompanying drawings. In the following description, when a detailed description of well-known functions or configurations related to the concepts of the present disclosure is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display apparatus according to embodiments of the present disclosure will be described in detail with reference to accompanying drawings.

FIG. 1A to FIG. 2B illustrate a foldable display apparatus 100 according to an embodiment of the present disclosure.

Figure 1B:
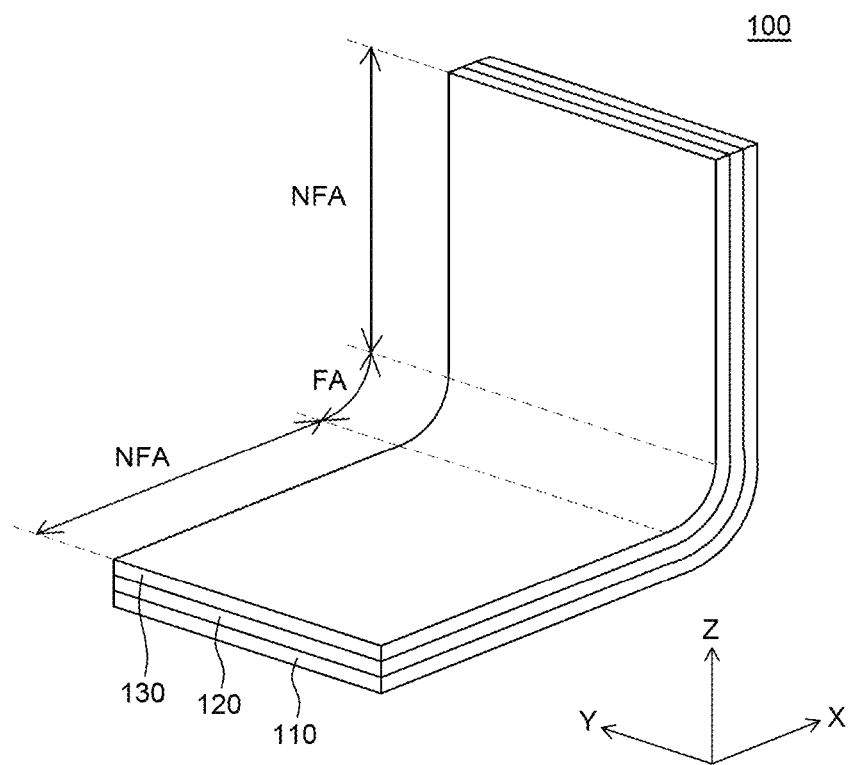
FIG. 1B is a perspective view of the foldable display apparatus of FIG. 1A in a folded state.

FIG. 1A is a plan view of the foldable display apparatus 100 according to an embodiment of the present disclosure. FIG. 1B is a perspective view showing the foldable display apparatus 100 in a folded state.

With reference to FIG. 1A and FIG. 1B, the foldable display apparatus 100 according to an embodiment of the present disclosure includes a display panel 110, an optical member 120 disposed on the display panel 100, and a window member 130 disposed on the optical member 120. Hereinafter, for convenience of description, it is assumed that the foldable display apparatus 100 according to an embodiment of the present disclosure is an organic light emitting display apparatus, but embodiments of the present disclosure are not limited thereto and may include other selected types of display apparatus.

With reference to FIG. 1A, the foldable display apparatus 100 according to an embodiment of the present disclosure includes a display area DA and a non-display area NDA. The display area DA may be an area where a plurality of pixels are disposed to substantially display an image. In particular, a plurality of pixels including a light emitting area configured to display an image, a thin film transistor configured to drive the pixels, and a capacitor may be disposed in the display area DA. One pixel may include a plurality of sub-pixels. The sub-pixels are minimum units constituting a display area, and each sub-pixel may be configured to emit light of a specific wavelength band. For example, each sub-pixel may be configured to emit red, green, blue, or white light. The non-display area NDA is disposed to surround the display area DA. The non-display area NDA may be an area where an image is not substantially displayed and various lines configured to drive pixels and driving elements disposed at the display area DA, and a driver integrated circuit ("IC") are disposed. For example, various ICs such as a gate driver IC and a data driver IC, and VSS (voltage supply of source) lines may be disposed at the non-display area NDA.

With reference to FIGS. 1A and 1B, the foldable display apparatus 100 according to an embodiment of the present disclosure includes a folding area FA and non-folding areas NFA on opposite sides of the folding area FA. The folding area FA may be an area that is folded when the foldable display apparatus 100 is folded, and may be folded according to a specific radius of curvature about a folding axis FX. For example, the folding axis FX of the folding area FA may be formed in a Y-axis direction, which is a short axis of the foldable display apparatus 100, and the non-folding area NFA may extend from the folding area FA in an X-axis direction perpendicular to the folding axis FX.

When the folding area FA of the foldable display apparatus 100 is folded about the folding axis FX, the folding area FA may form a part of a circle or an ellipse. The radius of curvature of the folding area FA may be a radius of a circle or an ellipse formed by the folding area FA. In some embodiments, an upper surface of the foldable display apparatus 100 is a display surface configured to display an image and a lower surface of the foldable display apparatus 100 is an opposite rear surface relative to the display surface. In such embodiments, the folding area FA may be folded in a method which is selected from an out-folding method in which the display surface of the foldable display apparatus 100 is folded to be exposed to the outside, or an in-folding method in which regions of the display surface of the foldable display apparatus 100 face each other.

The non-folding area NFA may be an area that is not folded when the foldable display apparatus 100 is folded. For example, the non-folding area NFA maintains a planar state when the foldable display apparatus 100 is folded. The non-folding area NFA may be disposed at both opposite sides of the folding area FA. For example, the non-folding area NFA may be an area extending from the folding area FA in an X-axis direction. The folding area FA may be disposed between the non-folding areas NFA. Also, when the foldable display apparatus 100 is folded with respect to the folding axis FX, the non-folding areas NFA may overlap each other.

FIGS. 1A and 1B illustrate that the foldable display apparatus 100 has one folding area FA and two non-folding areas NFA, but the numbers and positions of the folding area FA and the non-folding areas NFA may be selected according to design factors and are not limited thereto.

The foldable display apparatus 100 according to an embodiment of the present disclosure includes the display panel 110, the optical member 120, and the window member 130. The display panel 110, the optical member 120, and the window member 130 will be described in detail with reference to FIGS. 2A and 2B.

Figure 2A:
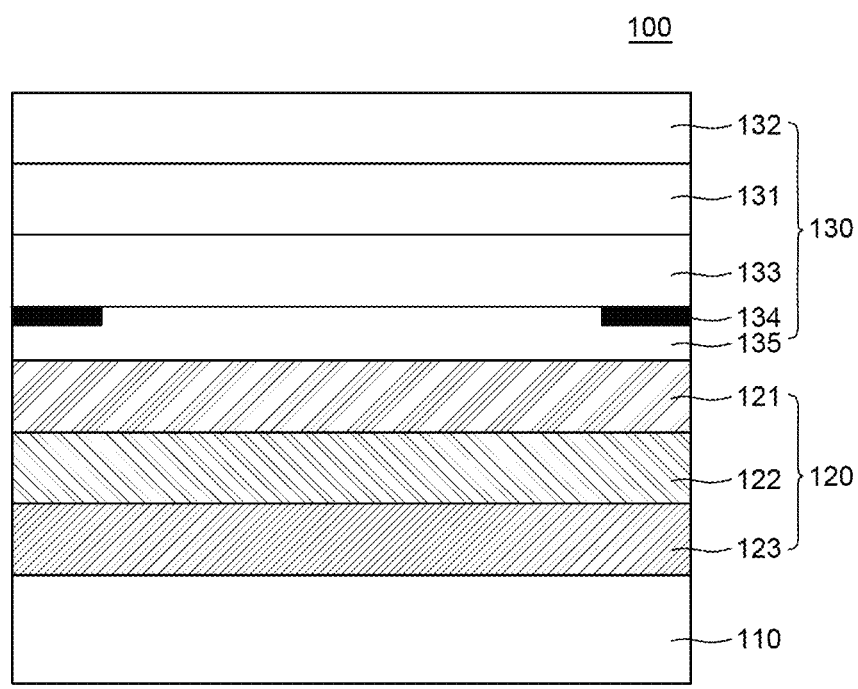
FIG. 2A is a cross-sectional view of the foldable display apparatus of FIG. 1A according to an embodiment of the present disclosure.
Figure 2B:
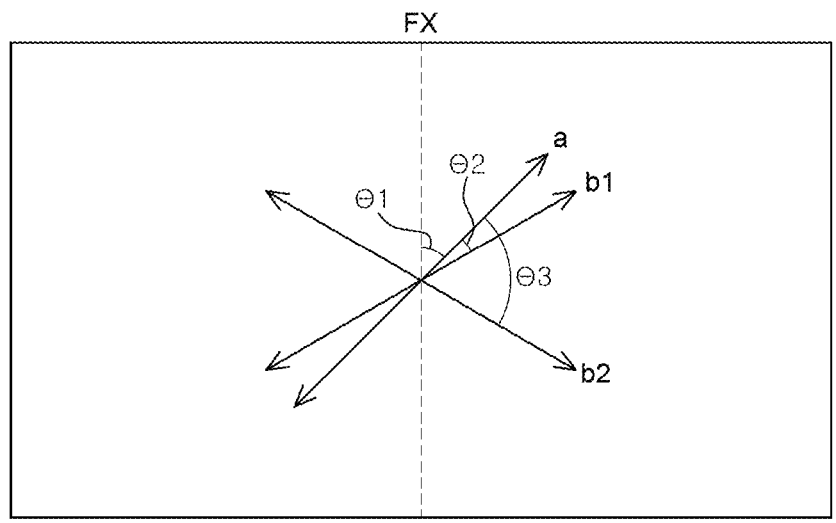
FIG. 2B is a plan view illustrating a relationship between optical axes of the foldable display apparatus of FIG. 1A according to an embodiment of the present disclosure.

FIG. 2A is a cross-sectional view of the foldable display apparatus 100 according to an embodiment of the present disclosure. FIG. 2B is a plan view illustrating a relationship between optical axes of the foldable display apparatus 100 according to an embodiment of the present disclosure.

With reference to FIG. 2A, the display panel 110 may be a panel on which an image is implemented and may include a display element for implementing an image and a circuit part for driving the display element. For example, when the foldable display apparatus 100 is an organic light emitting display apparatus, the display element may include an organic light emitting element. Hereinafter, for convenience of description, it is assumed that the foldable display apparatus 100 according to various embodiments of the present disclosure is a foldable display apparatus including an organic light emitting element, but embodiments of the present disclosure are not limited thereto.

The circuit part may include various thin film transistors, capacitors, lines (or wirings), and driving ICs configured to drive the organic light emitting element. For example, the circuit part may include various components such as a driving thin film transistor, a switching thin film transistor, a storage capacitor, a gate line, a data line, a gate driver IC, and a data driver IC, but embodiments of the present disclosure are not limited thereto.

In the foldable display apparatus 100, the display panel 110 includes a flexible substrate having a very thin thickness to implement flexibility. The flexible substrate may be formed of an insulating material having flexibility. For example, the flexible substrate may be a substrate of an insulating plastic which is polyimide, polyethersulfone, polyethylene terephthalate, or polycarbonate, or a combination thereof However, the flexible substrate is not limited thereto and may be formed of any material having flexibility that enables the foldable display apparatus 100 to be repeatedly folded without significant damage. While the flexible substrate has excellent flexibility, it is relatively thinner and less rigid than a glass substrate. Accordingly, when various elements are disposed at the flexible substrate, sagging of the substrate may occur. Accordingly, if necessary, a support member such as a back plate may be further disposed under the flexible substrate.

The back plate supports the flexible substrate so that the flexible substrate does not sag, and protects components disposed on the flexible substrate from external moisture, heat, and impacts. The back plate may be formed of a plastic material such as polymethylmethacrylate, polycarbonate, polyvinyl alcohol, acrylonitryl-butadiene-styrene, or polyethylene terephthalate, or a combination thereof, but embodiments of the present disclosure are not limited thereto. When the back plate is disposed under the flexible substrate, an adhesive layer may be disposed between the flexible substrate and the back plate to bond (or attach) them together. The adhesive layer may include a light-transparent adhesive, a pressure-sensitive adhesive, or a light-transparent resin, or some combination thereof, but the adhesive layer is not limited thereto.

The optical member 120 is disposed on the display panel 110 and in particular, the optical member 120 is disposed on a top surface of the display panel 110 in some embodiments. In some embodiments, an adhesive layer may be disposed between the display panel 110 and the optical member 120. The adhesive layer may be a light-transparent adhesive, a light-transparent resin, or a pressure-sensitive adhesive, or some combination thereof, but embodiments of the present disclosure are not limited thereto. The optical member 120 includes a second lower retardation layer 123, a first lower retardation layer 122, and a linear polarizer 121 sequentially stacked on the display panel 120 in a direction away from the top surface of the display panel 120 (i.e., the linear polarizer 121 is positioned further from the display panel 120 than the second lower retardation layer 123 as shown in FIG. 2A). The optical member 120 may be disposed on the display panel 110 and decrease reflectance of external light that is incident from the outside of the foldable display apparatus 100.

The linear polarizer 121 linearly polarizes light in one direction. For example, the linear polarizer 121 transmits light that coincides with a polarization axis and absorbs and linearly polarizes light that does not coincide with the polarization axis by a conjugated structure of an oriented dichroic dye or an oriented polymer chain itself.

The linear polarizer 121 may be a film type polarizer including a stretched polymer film. For example, the stretched polymer film may be a stretched polyvinylalcohol-based film. The linear polarizer 121 may be manufactured by adsorbing a dichroic dye on the stretched polymer film. For example, the linear polarizer 121 may be manufactured by adsorbing iodine onto a stretched polyvinyl alcohol film. For example, a direction in which the polymer film is stretched may be a light absorption axis of the linear polarizer 121, and a direction perpendicular to the stretched direction may be a light transmission axis of the linear polarizer 121. In an embodiment, an adhesive layer may be disposed between the linear polarizer 121 and the first lower retardation layer 122. The adhesive layer may be a light-transparent adhesive, a light-transparent resin, or a pressure-sensitive adhesive, or some combination thereof, but embodiments of the present disclosure are not limited thereto.

FIG. 2B illustrates optical axes of the foldable display apparatus 100 according to an embodiment of the present disclosure. In FIG. 2B, the folding axis FX is shown to be parallel to the Y-axis direction (see for example, FIGS. 1A and 1B), which is a short axis of the foldable display apparatus 100. With reference to FIG. 2B, a polarization axis a of the linear polarizer 121 has an angle θ1 of about 45° or about 135° with respect to the folding axis FX. Unless the context clearly dictates otherwise, "about 45°" or "about 135°" in embodiments of the present disclosure include an ordinary error range due to manufacturing process variations for achieving 45° or 135°. For example, the polarization axis a of the linear polarizer 121 has an angle θ1 of 45±5° or 135±5° with respect to the folding axis FX in some embodiments.

The polarization axis a may be a light absorption axis or a light transmission axis of the linear polarizer 121, and will be described below as a light transmission axis. Accordingly, in the foldable display apparatus 100 according to an embodiment of the present disclosure, the linear polarizer 121 transmits external light incident from the outside by linearly polarizing the external light at 45° or 135° with respect to the folding axis FX.

The linear polarizer 121 may further include at least one protective layer. For example, the linear polarizer 121 may further include a triacetyl cellulose (TAC) layer on at least one of upper and lower surfaces of the linear polarizer 121.

The first lower retardation layer 122 and the second lower retardation layer 123 are disposed under the linear polarizer 121. The first lower retardation layer 122 and the second lower retardation layer 123 may be formed of a material having birefringence properties or may have birefringence properties by appropriately orienting polymer chains. When external light incident through the linear polarizer 121 is reflected back by the display panel 110 and reaches the linear polarizer 121 again, the first lower retardation layer 122 and the second lower retardation layer 123 change a light path so that the light does not pass through the polarizer. Through this, it is possible to reduce the reflectance of external light.

The first lower retardation layer 122 and the second lower retardation layer 123 have optical anisotropy and change a polarized state of light. The first lower retardation layer 122 and the second lower retardation layer 123 may change light that has been transmitted through the linear polarizer 121 from a linearly polarized state to a circularly polarized state. In addition, the first lower retardation layer 122 and the second lower retardation layer 123 may change light in a circularly polarized state into a linearly polarized state.

For example, the first lower retardation layer 122 disposed under the linear polarizer 121 may be a $\lambda/2$ retarder (i.e., a half wavelength retarder), and the second lower retardation layer 123 disposed between the first lower retardation layer 122 and the display panel 110 may be a $\lambda/4$ retarder (i.e., a quarter wavelength retarder). The $\lambda/2$ retarder may be an optical layer that delays a phase of light by $\lambda/2$ or half a wavelength. For example, when a wavelength of light transmitted through the linear polarizer 121 and provided to the $\lambda/2$ retarder is 550 nm, the light that passes through the $\lambda/2$ retarder may have a phase retardation value of 275 nm. Also, the $\lambda/4$ retarder may be an optical layer that delays the phase of light by $\lambda/4$ or a quarter wavelength. For example, when a wavelength of light transmitted through the linear polarizer 121 and provided to the $\lambda/4$ retarder is 550 nm, the light that passes through the $\lambda/4$ retarder may have a phase retardation value of 137.5 nm.

With reference to FIG. 2B, the first lower retardation layer 122, which is a $\lambda/2$ retarder, delays a transmission speed of light, and has a slow axis b1 that is selected to have an angle θ2 of about 15° with respect to the polarization axis a of the linear polarizer 121. The second lower retardation layer 123 which is a $\lambda/4$ retarder, delays a transmission speed of external light that has been transmitted through the first lower retardation layer 122, and has a slow axis b2 that is selected to have an angle of about 75° with respect to the polarization axis a of the linear polarizer 121. Unless the context clearly dictates otherwise, "about 15°" and "about 75°" in embodiments of the present disclosure include an ordinary error range due to manufacturing process variations. For example, the slow axis b1 of the first lower retardation layer 122 has an angle θ2 of 15±5° with respect to the polarization axis a of the linear polarizer 121, and the slow axis b2 of the second lower retardation layer 123 has an angle θ3 of 75±5° with respect to the polarization axis a of the linear polarizer 121 in some embodiments.

In the foldable display apparatus 100 according to an embodiment of the present disclosure with the optical member 120 configured as described above, when external light passes through the optical member 120, the external light is linearly polarized by the linear polarizer 121 and is circularly polarized by the first lower retardation layer 122 and the second lower retardation layer 123. Thereafter, since the light that has been reflected by the display panel 110 is in a circularly polarized state, when the reflected light passes through the first lower retardation layer 122 and the second lower retardation layer 123 again and reaches the linear polarizer 121, the reflected light does not pass through the linear polarizer 121 having the polarization axis that is different from that of the reflected light and is mostly absorbed into the linear polarizer 121.

As a result, the foldable display apparatus 100 according to an embodiment of the present disclosure controls the angles of the polarization axis a of the linear polarizer 121, the slow axis b1 of the first lower retardation layer 122, and the slow axis b2 of the second lower retardation layer 123 that constitute the optical member 120 to greatly improve reflective visibility. In addition, the foldable display apparatus 100 of the present disclosure improves black visibility and reflective visibility due to small changes in reflection color even if a user's viewing angle is changed in a horizontal direction (leftward/rightward) or vertical direction (upward/downward) by minimizing the difference in reflection color at a main viewing angle.

The window member 130 may be disposed on the optical member 120 and in particular, on a top surface of the optical member 120 or a top surface (or an upper surface) of the linear polarizer 121 of optical member 120. The window member 130 includes a cover substrate 131, an upper retardation layer 132, decoration films 133 and 134, and an adhesive layer 135. The window member 130 is disposed on the optical member 120 and protects the optical member 120 and the display panel 110.

The cover substrate (or base cover) 131 protects the display apparatus 100 from external impacts and scratches. Accordingly, the cover substrate 131 may be formed of a material having excellent impact resistance and scratch resistance while being transparent.

For example, the cover substrate 131 may be reinforced glass. For example, the cover substrate 131 may be a thin plate reinforced glass. In the case of implementing the foldable display apparatus 100, a polymer film may be used as the cover substrate 131. In some non-limiting examples, the polymer film may be a film including a polymer such as polyimide, polyamide imide, polyethylene terephthalate, polymethyl methacrylate, polypropylene glycol, polycarbonate or the like. As another non-limiting example, the polymer film may be a photoisotropic polymer film such as a cycloolefin (co)polymer, a photoisotropic polycarbonate, a photoisotropic polymethylmethacrylate or the like.

The upper retardation layer 132 may be disposed on the cover substrate 131 and may be an outermost layer of the window member 130 in some embodiments. The upper retardation layer 132 prevents a blackout phenomenon that occurs when a user wears sunglasses or the like having a polarization function. For example, light emitted from the optical member 120 is linearly polarized by the linear polarizer 121 positioned at an uppermost portion of the optical member 120. Accordingly, when a user wears sunglasses having a polarizing function and sees the light emitted from the optical member 120, a blackout phenomenon may occur in which a screen is displayed in black without showing anything.

The upper retardation layer 132 may be formed of a material having a large retardation relative to other retardation layers described herein. For example, the upper retardation layer 132 may be formed of polyethylene terephthalate (PET). When the upper retardation layer 132 is formed of a material having a large retardation, the light that is emitted through the linear polarizer 121 and passes through the upper retardation layer 132 is not linearly polarized, and a blackout phenomenon due to linearly polarized light does not occur even if a user wears sunglasses or the like having a polarization function.

In addition, the upper retardation layer 132 may be a circularly polarized retardation film such as a λ/4 retarder. When the upper retardation layer 132 is a λ/4 retarder, the light that is emitted through the linear polarizer 121 is circularly polarized by the λ/4 retarder, so a blackout phenomenon due to linearly polarized light does not occur even if a user wears sunglasses or the like having a polarization function.

In some embodiments of the foldable display apparatus 100 according to the present disclosure, the upper retardation layer 132 may be omitted, and may also be replaced by the cover substrate 131 or the decoration films 133 and 134.

The decoration films 133 and 134 may be disposed between the optical member 120 and the cover substrate 131. The decoration films 133 and 134 prevent components such as lines disposed at the non-display area NDA of the display panel 110 from being visually recognized by a user, prevent light leakage, and protect the display panel 110 from external impacts. The decoration films 133 and 134 may be implemented as (or include), for example, a base layer 133 and a decoration layer 134.

The base layer 133 may be disposed on the optical member 120. The base layer 133 may be a substrate on which the decoration layer 134 is formed. In some embodiments, the base layer 133 is disposed between the decoration layers 133, 134 and the cover substrate 131. The base layer 133 is formed of a flexible and transparent polymer. For example, the base layer 133 may be formed of one or more polymers among polyethylene terephthalate, polyimide, polyamideimide, polycarbonate, polymethylmethacrylate, and cycloolefin (co)polymer. As a preferred example, the base layer 133 may include polyethylene terephthalate to reduce costs and sourcing issues without affecting optical properties of a display apparatus.

A thickness of the base layer 133 may be 10 μm to 200 μm or 30 μm to 100 μm. Within this range, cushioning properties are excellent, so that damage to the display panel 110 from external impacts may be prevented, and folding properties may be excellent relative to base layers with different thicknesses.

The decoration layer 134 may be disposed to overlap the non-display area NDA. The decoration layer 134 covers various lines, driver ICs and the like disposed at the non-display area NDA of the display panel 110 and reduces or eliminates recognition of these aspects by a user. The decoration layer 134 further blocks light leakage from the non-display area NDA. Accordingly, the decoration layer 134 may be a light blocking layer or a black matrix, and embodiments of the present disclosure are not limited to the above naming conventions.

The decoration layer 134 may be formed of a black material having high light blocking properties so that various lines disposed at the non-display area NDA are not visible to a user. However, embodiments of the present disclosure are not limited thereto, and the decoration layer 134 may be formed in various colors such as white, red, blue, and green, among others. In addition, the decoration layer 134 may be a multilayer structure in which decoration layers of different colors are stacked. In addition, the decoration layer 134 may include a logo or a trademark that identifies the display apparatus, or a pattern representing a phrase.

The adhesive layer 135 may be disposed between the decoration films 133 and 134 and the display panel 110. The adhesive layer 135 bonds the decoration films 133 and 134 onto the optical member 120 and thus the adhesive layer 135 may be in direct contact with the decoration films 133, 134 and the optical member 120 and more specifically, the linear polarizer 121 of the optical member 120. The adhesive layer 134 may be a light-transparent adhesive, a light-transparent resin, or a pressure-sensitive adhesive, or any combination thereof, but embodiments of the present disclosure are not limited thereto. The adhesive layer may function as an overcoating layer that covers the decoration layer 134 to remove a step between the base layer 133 and the decoration layer 134 in the decoration films.

The decoration films 133 and 134 may have a retardation function as well in some embodiments. For example, the base layer 133 constituting the decoration films 133 and 134 may be formed of a material having a retardation. In this case, instead of or together with the upper retardation layer 132, the decoration films 133 and 134 may prevent a blackout phenomenon that occurs when a user wears polarized sunglasses or the like while viewing the display apparatus 100.

For example, the base layer 133 constituting the decoration films has a retardation of 10 nm to 5000 nm at a wavelength of 550 nm. The retardation of the base layer 133 may be adjusted according to a type of the cover substrate 131 that is disposed on the decoration films 133 and 134. For example, when the cover substrate 131 is formed of a thin plate reinforced glass or photoisotropic polymer having no or very small retardation, the base layer 133 may have a high retardation of 2000 nm to 5000 nm at a wavelength of 550 nm. In addition, when the cover substrate 131 is formed of a polymer film having a high retardation, for example, polyimide, the base layer 133 may have a low retardation of 10 nm to 1000 nm at a wavelength of 550 nm. Thus, the amount of light retardation of the base layer 133 may be selected based on design factors.

As described with respect to the upper retardation layer 132, when a user wears sunglasses or the like having a polarization function, the light that is emitted through the linear polarizer 121 has linear polarization, so that a blackout phenomenon may occur in which a screen is displayed in black without showing anything. However, by eliminating linear polarization characteristics of the light that is emitted through the linear polarizer 121 with the use of the decoration films 133 and 134 having a retardation, even if a user wears sunglasses or the like having a polarization function, a blackout phenomenon due to linear polarization can be minimized or prevented altogether.

In some related art displays, when the cover substrate has a high retardation, circularly polarized light may be deformed into elliptically polarized light due to the retardation of the cover substrate, which may cause a rainbow mura phenomenon. When the elliptically polarized light passes through polarizing plates of the sunglasses, it is linearly polarized again. At this time, the rainbow mura phenomenon may occur due to differences in transmittance according to different wavelengths. Accordingly, in the case of using the decorative films 133 and 134 having a high retardation according to the present disclosure, the rainbow mura phenomenon may be suppressed by improving transmittance in the entire wavelength band of visible light.

The thickness of the base layer 133 constituting the decoration film may be 0.1 μm to 100 μm or 1 μm to 80 μm. When the thickness of the base layer 133 satisfies the above range, a high retardation may be given to the window member 130 and folding performance may be satisfied.

Figure 3A:
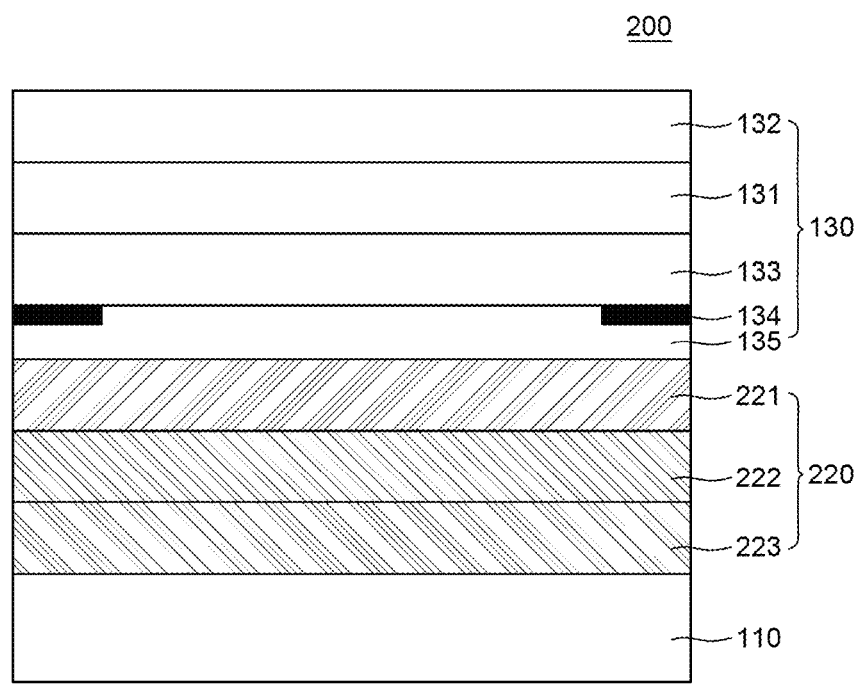
FIG. 3A is a cross-sectional view of a foldable display apparatus according to another embodiment of the present disclosure.
Figure 3B:
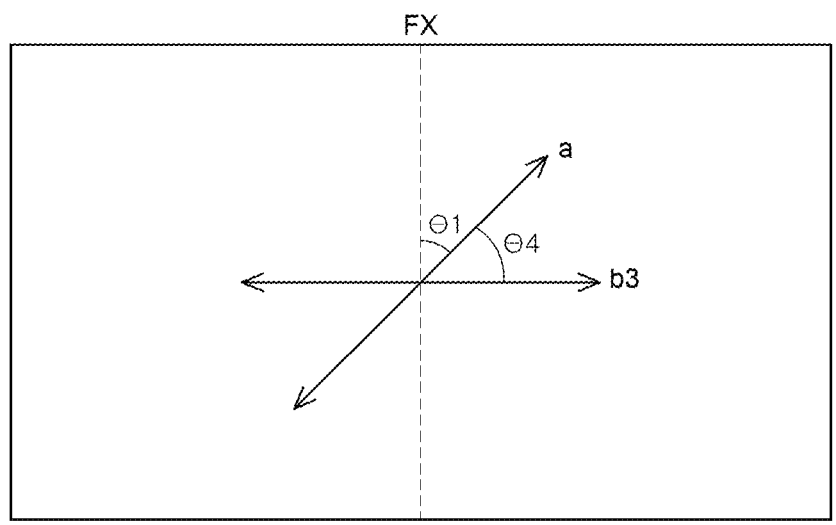
FIG. 3B is a plan view illustrating a relationship between optical axes of the foldable display apparatus of FIG. 3A according to another embodiment of the present disclosure.

FIGS. 3A and 3B illustrate a foldable display apparatus 200 according to another embodiment of the present disclosure. FIG. 3A is a cross-sectional view of the foldable display apparatus 200. FIG. 3B is a plan view illustrating a relationship between optical axes of the foldable display apparatus 200. The foldable display apparatus 200 illustrated in FIGS. 3A and 3B is substantially the same as the foldable display apparatus 100 illustrated in FIG. 1 to FIG. 2B except for a configuration of an optical member 220. Accordingly, a description of redundant components will be omitted.

With reference to FIG. 3A, the foldable display apparatus 200 according to another embodiment of the present disclosure includes the optical member 220 disposed on the display panel 110. The optical member 220 has a structure in which a second lower retardation layer 223, a first lower retardation layer 222, and a linear polarizer 221 are sequentially stacked in a direction away from the display panel 100. The optical member 220 may be disposed on the display panel 110 and decrease reflectance of external light incident from the outside of the foldable display apparatus 200.

The linear polarizer 221 of the foldable display apparatus 200 illustrated in FIGS. 3A and 3B performs the same function as and may be formed of the same material as the linear polarizer 121 of the foldable display apparatus 100 illustrated in FIG. 1 to FIG. 2B and thus, duplicate descriptions thereof will be omitted.

With reference to FIG. 3B, the polarization axis a of the linear polarizer 221 has an angle θ1 of about 45° or about 135° with respect to the folding axis FX.

The first lower retardation layer 222 and the second lower retardation layer 223 are disposed under the linear polarizer 221. The first lower retardation layer 222 and the second lower retardation layer 223 may be formed of a material having birefringence properties or may have birefringence properties by appropriately orienting polymer chains. When external light incident through the linear polarizer 221 is reflected back by the display panel 110 and reaches the linear polarizer 221 again, the first lower retardation layer 222 and the second lower retardation layer 223 change a light path of the reflected light so that the reflected light does not pass through the polarizer. In this way, it is possible to reduce the reflectance of external light in the display apparatus 200.

The first lower retardation layer 222 and the second lower retardation layer 223 have optical anisotropy and change a polarized state of light. The first lower retardation layer 222 and the second lower retardation layer 223 may change light that has been transmitted through the linear polarizer 221 from a linearly polarized state to a circularly polarized state. In addition, the first lower retardation layer 222 and the second lower retardation layer 223 may change light in a circularly polarized state into a linearly polarized state.

For example, the first lower retardation layer 222 disposed under the linear polarizer 221 is a λ/4 retarder, and the second lower retardation layer 223 disposed between the first lower retardation layer 222 and the display panel 110 is a positive C-plate. The λ/4 retarder is an optical layer that delays a phase of light by λ/4. For example, when a wavelength of light transmitted through the linear polarizer 221 and provided to the λ/4 retarder is 550 nm, the light that passes through the λ/4 retarder may have a phase retardation value of 137.5 nm. The positive C-plate is configured to compensate a phase retardation value in a thickness direction or an out-of-plane retardation (Rth). For example, the positive C-plate may have a phase retardation value Rth of −50 nm to −150 nm or 60 nm to −110 nm in the thickness direction, but embodiments of the present disclosure are not limited thereto.

With reference to FIG. 3B, when delaying the transmission speed of light, the first lower retardation layer 222 which is a λ/4 retarder has a slow axis b3 that is adjusted to have an angle θ4 of about 45° with respect to the polarization axis a of the linear polarizer 221. In embodiments of the present disclosure, "about 45°" includes an error in a manufacturing process for achieving a 45° angle. For example, the slow axis b3 of the first lower retardation layer 222 has an angle θ4 of 45±5° with respect to the polarization axis a of the linear polarizer 221 in some embodiments.

When external light passes through the optical member 220 of the foldable display apparatus 200, the external light is linearly polarized by the linear polarizer 221 and is circularly polarized by the first lower retardation layer 222 and the second lower retardation layer 223. Thereafter, since the light that has been reflected by the display panel 110 is in a circularly polarized state, when the reflected light passes through the first lower retardation layer 222 and the second lower retardation layer 223 again and reaches the linear polarizer 221, the reflected light does not pass through the linear polarizer 221 because the polarization axis is different from that of the reflected light. As a result, the reflected external light is mostly absorbed into the linear polarizer 221.

In addition, by controlling the angles of the polarization axis a of the linear polarizer 221 and the slow axis b3 of the first lower retardation layer 222 that constitute the optical member 220 within the above-described range and configuring the second lower retardation layer 223 with a positive C-plate in the display apparatus 200, reflective visibility can be greatly improved. For example, the foldable display apparatus 200 improves black visibility and reflective visibility due to small changes in reflection color even if a user's viewing angle is changed in a horizontal direction (leftward/rightward) or vertical direction (upward/downward) by minimizing the difference in reflection color at a main viewing angle.

Hereinafter, effects of the present disclosure described above will be described in more detail through embodiments and experimental examples. However, the following embodiments are for illustration of the present disclosure, and the scope of the present disclosure is not limited by the following embodiments.

Figure 4A:
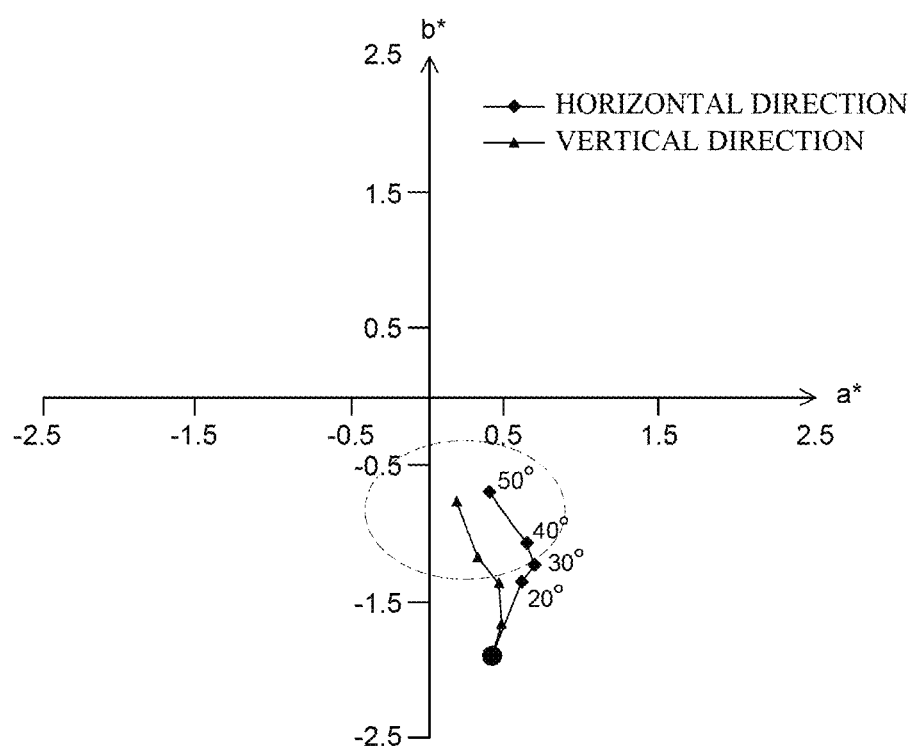
FIG. 4A is a graphical representation of CIE a*b* coordinates showing changes in reflection saturation according to changes in viewing angle of an optical member according to an embodiment of the present disclosure.
Figure 4B:
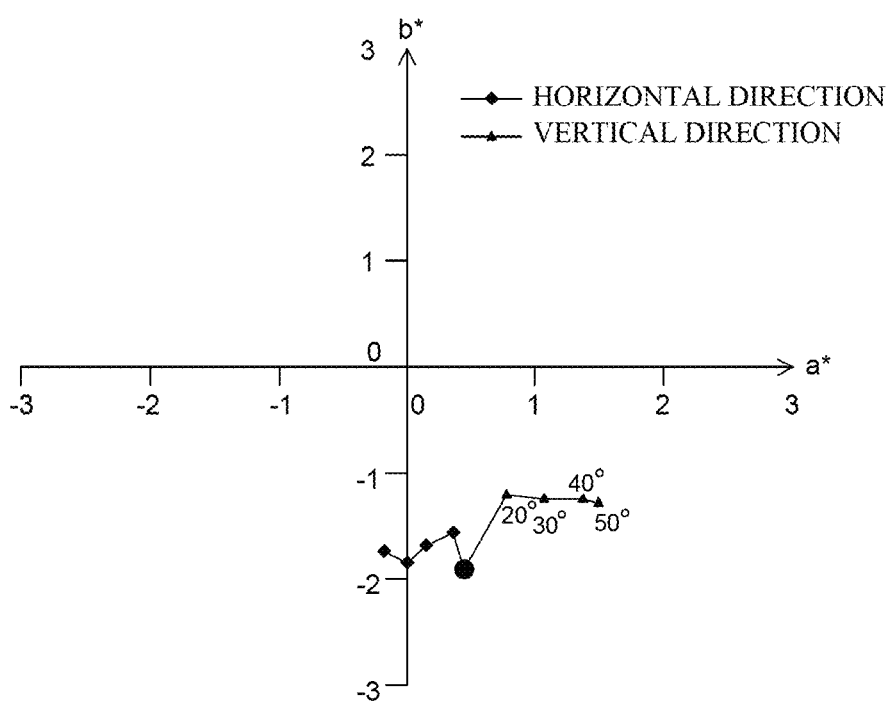
FIG. 4B is a graphical representation of CIE a*b* coordinates showing changes in reflection saturation according to changes in viewing angle of an optical member according to a comparative example of the present disclosure.
Figure 4C:
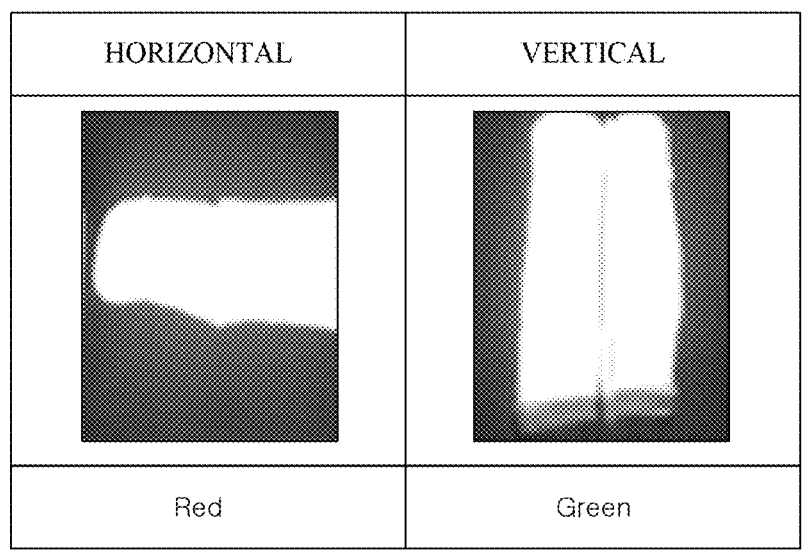
FIG. 4C is a photograph showing a color of the optical member of FIG. 4B at a viewing angle of 45°.

FIG. 4A is a graphical representation of CIE a*b* coordinates showing changes in reflection saturation according to changes in viewing angle of an optical member according to Embodiment 1. FIG. 4B is a graphical representation of CIE a*b* coordinates showing changes in reflection saturation according to changes in viewing angle of an optical member according to Comparative Example 1. FIG. 4C is a photograph showing a color of the optical member according to Comparative Example 1 at a viewing angle of 45°.

First, Embodiment 1 is a graphical representation of CIE a*b* coordinates for a foldable display apparatus including the optical member according to an embodiment of the present disclosure. In this case, as illustrated in FIG. 2B, the polarization axis a of the linear polarizer is +45° relative to folding axis FX, the slow axis b1 of the first lower retardation layer, which is a λ/2 retarder, is +15° with respect to the polarization axis a of the linear polarizer, and the slow axis b2 of the second lower retardation layer, which is a λ/4 retarder, is +75° with respect to the polarization axis a of this linear polarizer.

In Comparative Example 1 in FIG. 4B, the polarization axis a of the linear polarizer is +90° relative to the folding axis FX, the slow axis b1 of the first lower retardation layer, which is a λ/2 retarder, is +10° with respect to the polarization axis a of the linear polarizer, and the slow axis b2 of the second lower retardation layer, which is a λ/4 retarder, is +75° with respect to the polarization axis a of the linear polarizer.

By way of brief background "CIE" refers to a three-dimensional color space coordinate system defined by the International Commission on Illumination ("CIE") to represent colors within the spectrum of human visible light. The CIE system includes three axis, the L* axis representing the lightness of the color (i.e., L*=0 yields black and L*=100 indicates diffuse white), the a* axis representing a red-green axis (i.e., negative values on the a* axis indicate green and positive values indicate red) and the b* axis representing a yellow and blue axis (i.e., negative values on the b* axis indicate blue and positive values indicate yellow). To avoid obscuring the concepts of the disclosure, only the a* and b* axis are illustrated herein.

As a result, in FIGS. 4A and 4B, the a* axis may be referred to as a red-green axis, and the b* axis may be referred to as a yellow-blue axis. The origin of a*=0 and b*=0 means that reflection saturation is neutral black. From the origin toward a positive (+) direction of the a* axis, a red tendency increases, and as the a* axis goes in a negative (−) direction, a green tendency increases. In addition, from the origin toward a positive (+) direction of the b* axis, a yellow tendency increases, and as the b* axis goes in a negative (−) direction, a blue tendency increases.

With reference to FIG. 4B, when the viewing angle moves rightward in the optical member according to Comparative Example 1, the CIE a*b* coordinates gradually move in the negative (−) direction of the a* axis. In addition, when the viewing angle moves upwardly in the optical member according to Comparative Example 1, the CIE a*b* coordinates gradually move in the positive (+) direction of the a* axis. In Comparative Example 1, where the viewing angle is changed in the horizontal direction and changed in the vertical direction, the reflection saturation tends to move in different directions on the CIE a*b* coordinates. For example, in the optical member according to Comparative Example 1, a distance between the CIE a*b* coordinates at viewing angles in a horizontal direction and in a vertical direction gradually increases according to changes in viewing angle, so it can be confirmed that a difference in reflection color at a main viewing angle was exhibited remarkably.

In this regard, with reference to FIG. 4C, a photograph of the optical member according to Comparative Example 1 that was taken at 45° in the horizontal direction exhibits red light, but a photograph of the optical member according to Comparative Example 1 which was taken at 45° in the vertical direction exhibits green light. For example, as described with reference to FIG. 4B, it was confirmed that the optical member according to Comparative Example 1 exhibited remarkably different colors in reflected light according to changes in the viewing angle.

Next, with reference to FIG. 4A, when the viewing angle moves rightward in the optical member according to the Embodiment 1, the CIE a*b* coordinates gradually move in the positive (+) direction of the b* axis. In addition, even when the viewing angle moves upwardly in the optical member according to the Embodiment 1, the CIE a*b* coordinates gradually move in the positive (+) direction of the b* axis. In Embodiment 1, in a case in which the viewing angle is changed in the horizontal direction and in a case in which the viewing angle is changed in the vertical direction, the reflection saturation tends to move in the same direction on the CIE a*b* coordinates. This means that even when the viewing angle is changed, the difference in the reflection color at the main viewing angle is not large. For example, in Embodiment 1, reflective visibility is improved by minimizing or reducing the difference in reflection color at the main viewing angle. As, a result, the concepts of the disclosure minimize or reduce differences in reflection color at main viewing angles in a foldable display apparatus.

Figure 5A:
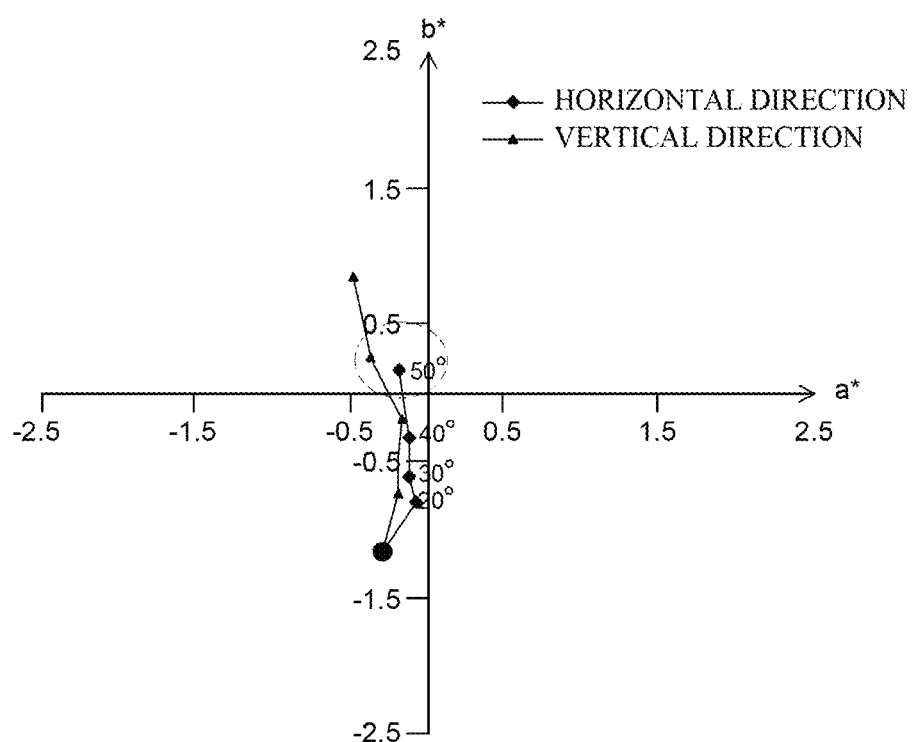
FIG. 5A is a graphical representation of CIE a*b* coordinates showing changes in reflection saturation according to changes in viewing angle of an optical member according to an embodiment of the present disclosure.
Figure 5B:
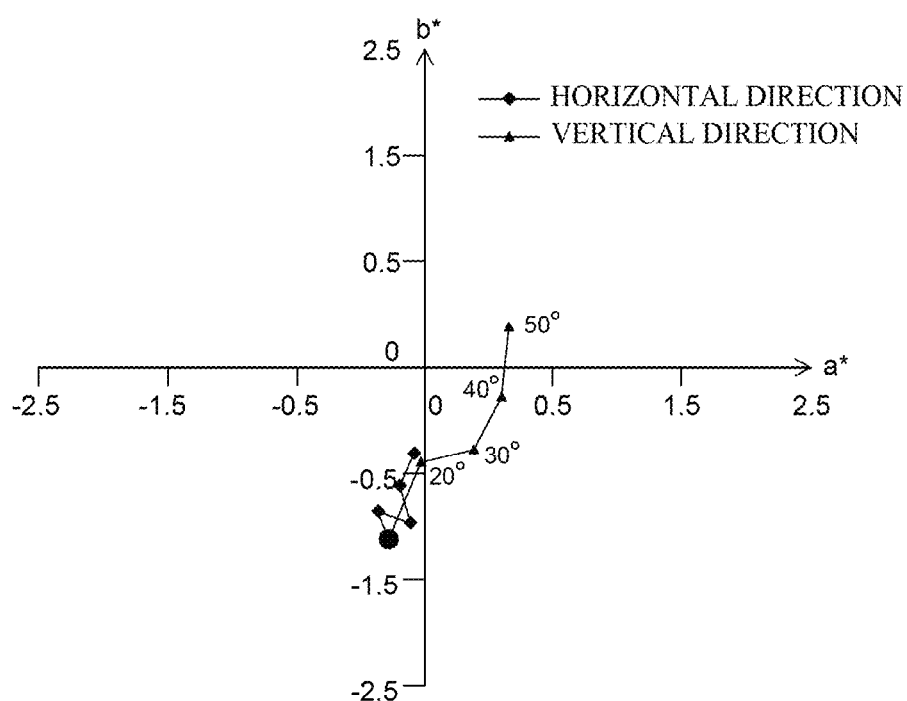
FIG. 5B is a graphical representation of CIE a*b* coordinates showing changes in reflection saturation according to changes in viewing angle of an optical member according to a comparative example of the present disclosure.
Figure 5C:
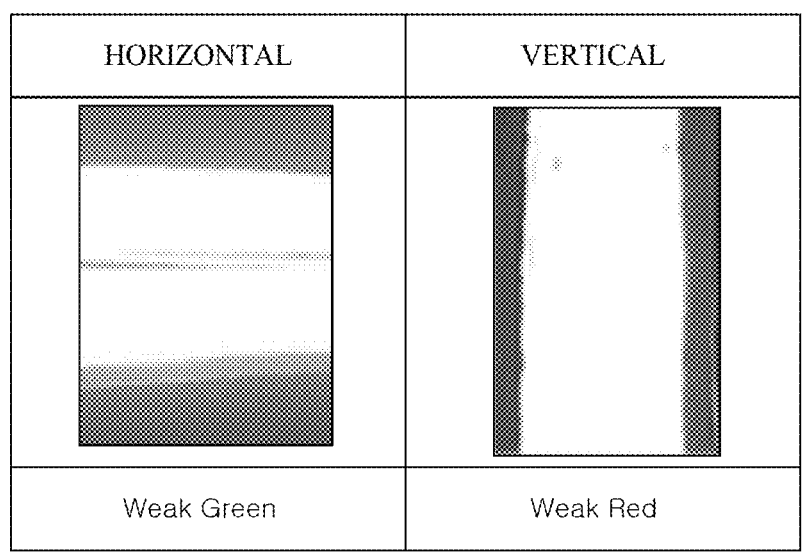
FIG. 5C is a photograph showing a color of the optical member of FIG. 5B at a viewing angle of 45°.

FIG. 5A is a graphical representation of CIE a*b* coordinates showing changes in reflection saturation according to changes in a viewing angle of an optical member according to Embodiment 2. FIG. 5B is a graphical representation CIE a*b* coordinates showing changes in reflection saturation according to changes in a viewing angle of an optical member according to Comparative Example 2. FIG. 5C is a photograph showing a color of the optical member according to Comparative Example 2 at a viewing angle of 45°.

Embodiment 2 is a foldable display apparatus including the optical member according to another embodiment of the present disclosure. As illustrated in FIG. 3B, the polarization axis a of the linear polarizer is +90° relative to the folding axis FX, the slow axis b3 of the first lower retardation layer, which is a λ/4 retarder, is +45° with respect to the polarization axis a of the linear polarizer, and the positive C-plate was used as the second lower retardation layer under the first lower retardation layer.

In Comparative Example 2, the polarization axis a of the linear polarizer is +90° relative to the folding axis FX, the slow axis b3 of the first lower retardation layer, which is a λ/2 retarder, is +45° with respect to the polarization axis a of the linear polarizer, and the positive C-plate was used as the second lower retardation layer under the first lower retardation layer.

With reference to FIG. 5B, when the viewing angle moves rightward (i.e., horizontally) in the optical member according to Comparative Example 2, the CIE a*b* coordinates gradually move slightly in the positive (+) direction of the b* axis. When the viewing angle moves upwardly, the CIE a*b* coordinates drastically move in the positive (+) direction of the b* axis and in the positive (+) direction of the a* axis. Accordingly, in the optical member according to Comparative Example 2, a distance between the CIE a*b* coordinates at viewing angles in the horizontal direction and in the vertical direction gradually increases according to changes in viewing angle. As a result, as the viewing angle changes, a difference in reflection color at a main viewing angle is large, and reflective visibility is not good.

In this regard, with reference to FIG. 5C, a photograph of the optical member according to Comparative Example 2 taken at 45° in the horizontal direction exhibits weak green light, but a photograph of the optical member according to Comparative Example 2 taken at 45° in the vertical direction exhibits weak red light. For example, as described in FIG. 5B, it was confirmed that the optical member according to Comparative Example 2 exhibited remarkably different colors in reflected light according to changes in viewing angle.

With reference to FIG. 5A, when the viewing angle moves rightward in the optical member according to Embodiment 2, the CIE a*b* coordinates gradually move in the positive (+) direction of the b* axis. In addition, even when the viewing angle moves upwardly, the CIE a*b* coordinates gradually move in the positive (+) direction of the b* axis. For example, in Embodiment 2, in a case in which the viewing angle is changed in the horizontal direction and in a case in which the viewing angle is changed in the vertical direction, reflection saturation tends to move by a similar degree in the same direction on the CIE a*b* coordinates relative to Comparative Example 2. This means that even when the viewing angle is changed, a difference in reflection color at a main viewing angle is not large. Thus, in Embodiment 2, the difference in reflection color at the main viewing angle is minimized utilizing the concepts of the optical member 120 described herein, thereby improving reflective visibility.

Hereinafter, in the foldable display apparatus according to an embodiment of the present disclosure, it was confirmed whether or not a blackout phenomenon and a rainbow mura phenomenon occur in embodiments of the display apparatus with and without a decoration film having a retardation function when a user wears sunglasses.

Figure 6:
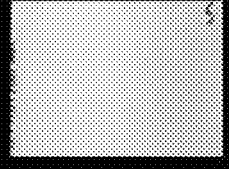
FIG. 6 is an array of photographs showing whether or not a blackout phenomenon and a rainbow phenomenon occur when a user wears sunglasses and views a foldable display apparatus according to embodiments and comparative examples of the present disclosure.

FIG. 6 is an array of photographs showing whether a blackout phenomenon and a rainbow mura phenomenon occur when a user wears sunglasses according to different embodiments and comparative examples of the present disclosure.

In Comparative Example 3, a polyimide film having a high retardation was disposed as a cover substrate on the optical member according to Embodiment 1. In Embodiment 3, a decoration film formed of PET having a high retardation was further disposed between the optical member of Comparative Example 3 and the polyimide film. In Comparative Example 4, a thin plate reinforced glass having no retardation was disposed as a cover substrate on the optical member according to Embodiment 1. In Embodiment 4, a decorative film formed of PET having a high retardation was further disposed between the optical member of Comparative Example 4 and the thin plate reinforced glass.

In Embodiment 3, the flexible display apparatus includes a decoration film having a high retardation was disposed between an optical member including a linear polarizer and a cover substrate according to the concepts of the disclosure. In Embodiment 4, the flexible display apparatus includes a polyimide film having a high retardation as the cover substrate and a decoration film having a high retardation between the optical member and the polyimide film. FIG. 6 shows photographs corresponding to whether or not blackout occurred by photographing samples according to Comparative Example 3, Embodiment 3, Comparative Example 4 and Embodiment 4 from the front, and whether or not rainbow mura occurred by photographing the samples at a specific viewing angle by a user wearing sunglasses with a polarizing lens.

With reference to FIG. 6, when a decoration film having a high retardation was disposed between an optical member including a linear polarizer and a cover substrate as in Embodiment 3, it was confirmed that no blackout phenomenon occurred when a user wears sunglasses. In addition, when the flexible display apparatus includes a polyimide film having a high retardation is used as the cover substrate and a decoration film having a high retardation between the optical member and the polyimide film as in Embodiment 4, it may be possible to prevent rainbow mura. As a result, the concepts of the present disclosure provide a flexible display apparatus with an optical member and a window member with a structure to reduce or eliminate reflections that may distort an image displayed on the apparatus in external light as well as to reduce or eliminate a blackout phenomenon and rainbow mura when viewing the flexible display apparatus through sunglasses.

A foldable display apparatus according to embodiments of the present disclosure may also be described as follows.

According to an embodiment of the present disclosure, a foldable display apparatus comprises a display panel including a folding area that is folded about a folding axis and a non-folding area, a first lower retardation layer on the display panel, a second lower retardation layer between the display panel and the first lower retardation layer, a linear polarizer disposed on the first lower retardation layer and having a polarization axis of 45±5° or 135±5° with respect to the folding axis, and a window member on the linear polarizer.

According to some embodiments of the present disclosure, the first lower retardation layer may include a λ/2 retarder having a slow axis of 15±5° with respect to the polarization axis of the linear polarizer, the second lower retardation layer may include a λ/4 retarder having a slow axis of 75±5° with respect to the polarization axis of the linear polarizer.

According to some embodiments of the present disclosure, the slow axis of the first lower retardation layer and the slow axis of the second lower retardation layer may be in a same direction with respect to the polarization axis of the linear polarizer.

According to some embodiments of the present disclosure, the first lower retardation layer may include a λ/4 retarder having a slow axis of 45±5° with respect to the polarization axis of the linear polarizer, the second lower retardation layer may be a positive C-plate.

According to some embodiments of the present disclosure, a phase retardation value of the positive C-plate in a thickness direction may be −60 nm to −110 nm.

According to some embodiments of the present disclosure, the window member may include a cover substrate and an upper retardation layer disposed on the cover substrate, the upper retardation layer may include a λ/4 retarder.

According to some embodiments of the present disclosure, the window member may include a cover substrate and a decoration film disposed under the cover substrate, the decoration film may have a retardation of 10 nm to 5000 nm at a wavelength of light of 550 nm.

According to some embodiments of the present disclosure, the cover substrate may be reinforced glass, the decoration film may have a retardation of 2000 nm to 5000 nm at a wavelength of light of 550 nm.

According to some embodiments of the present disclosure, the cover substrate may include a polymer film having a retardation, the decoration film may have a retardation of 10 nm to 1000 nm at a wavelength of light of 550 nm.

According to some embodiments of the present disclosure, a thickness of the decoration film may be in a range of 0.1 μm to 100 μm.

According to some embodiments of the present disclosure, a thickness of the decoration film may be in range of 1 μm to 80 μm.

A foldable display apparatus according to an embodiment of the present disclosure includes: a display panel including a folding area and a non-folding area, the folding area configured to fold about a folding axis; a first retardation layer on the display panel; a second retardation layer on the first retardation layer; and a linear polarizer disposed on the second retardation layer, the linear polarizer having a polarization axis of 45±5° or 135±5° with respect to the folding axis of the display panel.

According to some embodiments of the present disclosure, the foldable display apparatus may further include a window member on the linear polarizer.

According to some embodiments of the present disclosure, the window member may further include a cover substrate, a third retardation layer, at least one decoration film, and an adhesive layer.

According to some embodiments of the present disclosure, the first retardation layer may further include a λ/2 retarder having a slow axis of 15±5° with respect to the polarization axis of the linear polarizer or a λ/4 retarder having a slow axis of 45±5° with respect to the polarization axis of the linear polarizer.

According to some embodiments of the present disclosure, the second retardation layer may be a λ/4 retarder having a slow axis of 75±5° with respect to the polarization axis of the linear polarizer or the second retardation layer includes a positive C-plate.

A foldable display apparatus according to an embodiment of the present disclosure includes: a display panel having a folding area configured to fold about a folding axis; at least one retardation layer on the display panel; a linear polarizer disposed on the at least one retardation layer, the linear polarizer having a polarization axis of 45±5° or 135±5° with respect to the folding axis of the display panel; and a window member on the linear polarizer.

According to some embodiments of the present disclosure, the at least one retardation layer may further include a first retardation layer on the display panel and a second retardation layer on the first retardation layer, the linear polarizer on the second retardation layer.

According to some embodiments of the present disclosure, the first retardation layer may further include a λ/2 retarder having a slow axis of 15±5° with respect to the polarization axis of the linear polarizer or a λ/4 retarder having a slow axis of 45±5° with respect to the polarization axis of the linear polarizer, and According to some embodiments of the present disclosure, the second retardation layer may be a λ/4 retarder having a slow axis of 75±5° with respect to the polarization axis of the linear polarizer or the second retardation layer includes a positive C-plate.

According to some embodiments of the present disclosure, the window member may include a λ/4 retardation layer.

According to some embodiments of the present disclosure, the window member may include a cover substrate disposed on the retardation substrate and a decoration film disposed under the cover substrate.

According to some embodiments of the present disclosure, the decoration film may have a retardation of 10 nm to 5000 nm at a wavelength of light of 550 nm.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

The invention claimed is:

1. A foldable display apparatus, comprising:
   a display panel including a folding area and a non-folding area, the folding area configured to fold about a folding axis;
   a first lower retardation layer on the display panel;
   a second lower retardation layer between the display panel and the first lower retardation layer;
   a linear polarizer disposed on the first lower retardation layer, the linear polarizer having a polarization axis of 45±5° or 135±5° with respect to the folding axis of the display panel; and
   a window member on the linear polarizer,
   wherein the first lower retardation layer includes a λ/2 retarder having a slow axis of 15±5° with respect to the polarization axis of the linear polarizer, and
   wherein the second lower retardation layer includes λ/2 retarder having a slow axis of 75±5° with respect to the polarization axis of the linear polarizer.

2. The foldable display apparatus of claim 1, wherein the slow axis of the first lower retardation layer and the slow axis of the second lower retardation layer are in a same direction with respect to the polarization axis of the linear polarizer.

3. The foldable display apparatus of claim 1, wherein the first lower retardation layer and the second lower retardation layer are disposed under the linear polarizer.

4. The foldable display apparatus of claim 1, wherein the linear polarizer is configured to linearly polarize external light incident upon the linear polarizer and the first lower retardation layer and the second lower retardation layer are each configured to circularly polarize the external light incident on the first lower retardation layer and the second lower retardation layer.

5. The foldable display apparatus of claim 1, wherein the window member is disposed on a top surface of the linear polarizer.

6. The foldable display apparatus of claim 1, wherein the window member includes a cover substrate, an upper retardation layer, at least one decoration film, and an adhesive layer.

7. A foldable display apparatus, comprising:
a display panel including a folding area and a non-folding area, the folding area configured to fold about a folding axis;
a first retardation layer on the display panel;
a second retardation layer on the first retardation layer; and
a linear polarizer disposed on the second retardation layer, the linear polarizer having a polarization axis of 45±5° or 135±5° with respect to the folding axis of the display panel,
wherein the second retardation layer is a λ/4 retarder having a slow axis of 75±5° with respect to the polarization axis of the linear polarizer or the second retardation layer includes a positive C-plate.

8. The foldable display apparatus of claim 7, further comprising:
a window member on the linear polarizer.

9. The foldable display apparatus of claim 8, wherein the window member includes a cover substrate, a third retardation layer, at least one decoration film, and an adhesive layer.

10. The foldable display apparatus of claim 7, wherein the first retardation layer includes a λ/2 retarder having a slow axis of 15+5° with respect to the polarization axis of the linear polarizer or a λ/4 retarder having a slow axis of 45+5° with respect to the polarization axis of the linear polarizer.

11. The foldable display apparatus of claim 8, wherein the slow axis of the first retardation layer and the slow axis of the second retardation layer are in a same direction with respect to the polarization axis of the linear polarizer.

12. A foldable display apparatus, comprising:
a display panel having a folding area configured to fold about a folding axis;
at least one retardation layer on the display panel;
a linear polarizer disposed on the at least one retardation layer, the linear polarizer having a polarization axis of 45±5° or 135±5° with respect to the folding axis of the display panel; and
a window member on the linear polarizer,
wherein the window member includes:
a λ/4 retardation layer;
a cover substrate disposed under the λ/4 retardation layer; and
a decoration film disposed under the cover substrate.

13. The foldable display apparatus of claim 12, wherein the at least one retardation layer includes a first retardation layer on the display panel and a second retardation layer on the first retardation layer, the linear polarizer on the second retardation layer.

14. The foldable display apparatus of claim 13, wherein the first retardation layer includes a λ/2 retarder having a slow axis of 15±5° with respect to the polarization axis of the linear polarizer or a λ/4 retarder having a slow axis of 45±5° with respect to the polarization axis of the linear polarizer, and
the second retardation layer is a λ/4 retarder having a slow axis of 75±5° with respect to the polarization axis of the linear polarizer or the second retardation layer includes a positive C-plate.

15. The foldable display apparatus of claim 12, wherein the decoration film has a retardation of 10 nm to 5000 nm at a wavelength of light of 550 nm.

16. The foldable display apparatus of claim 12, wherein the decoration film includes a first decoration film and a second decoration film.

17. The foldable display apparatus of claim 12, wherein the window member is a multi-layer stack including from top to bottom, the cover substrate, the λ/4 retardation layer, and the decorative film.

* * * * *

UNITED STATES PATENT AND TRADEMARK OFFICE
CERTIFICATE OF CORRECTION

PATENT NO. : 12,379,606 B2
APPLICATION NO. : 17/526763
DATED : August 5, 2025
INVENTOR(S) : JongGun Lee et al.

Page 1 of 1

It is certified that error appears in the above-identified patent and that said Letters Patent is hereby corrected as shown below:

In the Claims

<u>Column 18, Claim 1, Line 55:</u>
"$\lambda/2$" should read: -- $\lambda/4$ --.

<u>Column 19, Claim 10, Line 36:</u>
"15+5°" should read: -- $15\pm5°$ --.

<u>Column 19, Claim 10, Line 37:</u>
"45+5°" should read: -- $45\pm5°$ --.

Signed and Sealed this
Twenty-eighth Day of October, 2025

John A. Squires
*Director of the United States Patent and Trademark Office*